(12) United States Patent
Khlat

(10) Patent No.: US 11,909,385 B2
(45) Date of Patent: Feb. 20, 2024

(54) FAST-SWITCHING POWER MANAGEMENT CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/073,764

(22) Filed: Oct. 19, 2020

(65) Prior Publication Data

US 2022/0123744 A1 Apr. 21, 2022

(51) Int. Cl.
*H03K 17/30* (2006.01)
*H02J 50/10* (2016.01)
*G06F 1/3203* (2019.01)

(52) U.S. Cl.
CPC ......... *H03K 17/302* (2013.01); *G06F 1/3203* (2013.01); *H02J 50/10* (2016.02)

(58) Field of Classification Search
None
See application file for complete search history.

(56) References Cited

U.S. PATENT DOCUMENTS

| | | |
|---|---|---|
| 5,510,753 A | 4/1996 | French |
| 5,838,732 A | 11/1998 | Carney |
| 6,107,862 A | 8/2000 | Mukainakano et al. |
| 6,141,377 A | 10/2000 | Sharper et al. |
| 6,141,541 A | 10/2000 | Midya et al. |
| 6,411,531 B1 | 6/2002 | Nork et al. |
| 6,985,033 B1 | 1/2006 | Shirali et al. |
| 7,043,213 B2 | 5/2006 | Robinson et al. |
| 7,193,467 B2 | 3/2007 | Garlepp et al. |
| 7,471,155 B1 | 12/2008 | Levesque |
| 7,570,931 B2 | 8/2009 | McCallister et al. |

(Continued)

FOREIGN PATENT DOCUMENTS

| | | |
|---|---|---|
| CN | 103916093 A | 7/2014 |
| CN | 105322894 A | 2/2016 |

(Continued)

OTHER PUBLICATIONS

Quayle Action for U.S. Appl. No. 16/589,940, mailed Dec. 4, 2020, 8 pages.

(Continued)

*Primary Examiner* — Thomas J. Hiltunen
*Assistant Examiner* — Khareem E Almo
(74) *Attorney, Agent, or Firm* — Withrow & Terranova, P.L.L.C.

(57) ABSTRACT

A fast-switching power management circuit is provided. The fast-switching power management circuit is configured to generate an output voltage(s) based on an output voltage target that may change on a per-frame or per-symbol basis. In embodiments disclosed herein, the fast-switching power management circuit can be configured to adapt (increase or decrease) the output voltage(s) within a very short switching interval (e.g., less than one microsecond). As a result, when the fast-switching power management circuit is employed in a wireless communication apparatus to supply the output voltage(s) to a power amplifier circuit(s), the fast-switching power management circuit can quickly adapt the output voltage(s) to help improve operating efficiency and linearity of the power amplifier circuit(s).

17 Claims, 3 Drawing Sheets

(56) References Cited

U.S. PATENT DOCUMENTS

| | | |
|---|---|---|
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 * | 5/2014 | Korzeniowski ....... H02M 3/158 323/267 |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 | 1/2015 | Jones |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 * | 2/2016 | Henshaw .................. H03F 1/02 |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,361,744 B1 | 7/2019 | Khlat |
| 10,382,071 B2 | 8/2019 | Rozek et al. |
| 10,476,437 B2 | 11/2019 | Nag et al. |
| 10,862,431 B1 | 12/2020 | Khlat |
| 10,879,804 B2 | 12/2020 | Kim et al. |
| 11,050,433 B1 * | 6/2021 | Melanson ................ H04R 3/00 |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2003/0107428 A1 | 6/2003 | Khouri et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0036212 A1 | 2/2007 | Leung et al. |
| 2007/0052474 A1 | 3/2007 | Saito |
| 2007/0258602 A1 | 11/2007 | Vepsalainen et al. |
| 2007/0290748 A1 | 12/2007 | Woo et al. |
| 2008/0116960 A1 | 5/2008 | Nakamura |
| 2008/0231358 A1 | 9/2008 | Maemura |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0283534 A1 * | 11/2010 | Pierdomenico ....... H03F 3/4508 327/536 |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0148705 A1 | 6/2011 | Kenington |
| 2011/0175681 A1 | 7/2011 | Namori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0281597 A1 * | 11/2012 | Khlat ....................... H03F 3/72 455/571 |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0072139 A1 | 3/2013 | Kang et al. |
| 2013/0100991 A1 | 4/2013 | Woo |
| 2013/0127548 A1 * | 5/2013 | Popplewell ............. H03F 3/211 330/297 |
| 2013/0130724 A1 | 5/2013 | Kumar Reddy et al. |
| 2013/0141064 A1 * | 6/2013 | Kay ......................... H03F 1/26 323/271 |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 * | 2/2014 | Khlat .................. H03F 3/45663 330/127 |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0169427 A1 | 6/2014 | Asenio et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0213196 A1 | 7/2014 | Langer et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |
| 2015/0188432 A1 | 7/2015 | Vannorsdel et al. |
| 2015/0234402 A1 * | 8/2015 | Kay ....................... H03F 1/0227 323/271 |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0333781 A1 | 11/2015 | Alon et al. |

(56) References Cited

U.S. PATENT DOCUMENTS

| | | |
|---|---|---|
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1* | 9/2018 | Wigney ............... H02J 7/0047 |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328720 A1 | 10/2020 | Khlat |
| 2020/0336105 A1* | 10/2020 | Khlat ............... H03F 1/0211 |
| 2020/0336111 A1 | 10/2020 | Khlat |
| 2020/0350865 A1 | 11/2020 | Khlat |
| 2020/0382061 A1* | 12/2020 | Khlat ............... H04B 1/16 |
| 2021/0036604 A1* | 2/2021 | Khlat ............... H02M 3/07 |
| 2021/0159590 A1 | 5/2021 | Na et al. |
| 2021/0175896 A1* | 6/2021 | Melanson ............ H03M 3/502 |
| 2021/0184708 A1 | 6/2021 | Khlat |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0226585 A1 | 7/2021 | Khlat |
| 2021/0234513 A1 | 7/2021 | Khlat |
| 2021/0265953 A1 | 8/2021 | Khlat |
| 2021/0288615 A1* | 9/2021 | Khlat ............... H03F 3/245 |
| 2022/0224294 A1 | 7/2022 | Khlat et al. |
| 2022/0263474 A1 | 8/2022 | Khlat |
| 2022/0278651 A1 | 9/2022 | Khlat |
| 2022/0286094 A1 | 9/2022 | Granger-Jones et al. |
| 2022/0385239 A1 | 12/2022 | Khlat |
| 2022/0399861 A1 | 12/2022 | Khlat |

FOREIGN PATENT DOCUMENTS

| | | | |
|---|---|---|---|
| CN | 105680807 A | 6/2016 | |
| CN | 106208974 A | 12/2016 | |
| CN | 106209270 A | 12/2016 | |
| CN | 106877824 A | 6/2017 | |
| CN | 107093987 A | 8/2017 | |
| CN | 108141184 A | 6/2018 | |
| CN | 109150212 A | 1/2019 | |
| EP | 3174199 A2 | 5/2012 | |
| EP | 2909928 A1 | 8/2015 | |
| JP | H03104422 A | 5/1991 | |
| WO | 2018182778 A1 | 10/2018 | |
| WO | WO-2020206246 A1 * | 10/2020 | |
| WO | WO-2021016350 A1 * | 1/2021 | .......... H03F 1/0222 |
| WO | WO-2021046453 A1 * | 3/2021 | ............ H04L 27/34 |

OTHER PUBLICATIONS

Notice of Allowance for U.S. Appl. No. 16/122,611, dated Jan. 13, 2021, 8 pages.

Notice of Allowance for U.S. Appl. No. 16/284,023, dated Jan. 19, 2021, 7 pages.

Notice of Allowance for U.S. Appl. No. 16/415,812, dated Feb. 16, 2021, 8 pages.

Non-Final Office Action for U.S. Appl. No. 16/689,236 dated Mar. 2, 2021, 15 pages.

Notice of Allowance for U.S. Appl. No. 16/435,940, dated Dec. 21, 2020, 7 pages.

Notice of Allowance for U.S. Appl. No. 16/774,060, dated Feb. 3, 2021, 7 pages.

Notice of Allowance for U.S. Appl. No. 16/590,790, dated Jan. 27, 2021, 7 pages.

Notice of Allowance for U.S. Appl. No. 16/561,061, dated Feb. 10, 2021, 7 pages.

Non-Final Office Action for U.S. Appl. No. 14/836,634, dated May 16, 2016, 9 pages.

Non-Final Office Action for U.S. Appl. No. 14/868,890, dated Jul. 14, 2016, 13 pages.

Non-Final Office Action for U.S. Appl. No. 15/792,909, dated May 18, 2018, 13 pages.

Notice of Allowance for U.S. Appl. No. 15/459,449, dated Mar. 28, 2018, 7 pages.

Notice of Allowance for U.S. Appl. No. 15/723,460, dated Jul. 24, 2018, 8 pages.

Notice of Allowance for U.S. Appl. No. 15/704,131, dated Jul. 17, 2018, 7 pages.

Notice of Allowance for U.S. Appl. No. 15/728,202, dated Aug. 2, 2018, 7 pages.

Non-Final Office Action for U.S. Appl. No. 15/888,300, dated Aug. 28, 2018, 11 pages.

Notice of Allowance for U.S. Appl. No. 15/792,909, dated Dec. 19, 2018, 11 pages.

Notice of Allowance for U.S. Appl. No. 15/993,705, dated Oct. 31, 2018, 7 pages.

Pfister, Henry, "Discrete-Time Signal Processing," Lecture Note, pfister.ee.duke.edu/courses/ece485/dtsp.pdf, Mar. 3, 2017, 22 pages.

(56) References Cited

OTHER PUBLICATIONS

Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, mailed Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, mailed Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/834,049, dated Jun. 24, 2021, 8 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
Notice of Allowance for U.S. Appl. No. 16/122,611, dated Apr. 1, 2021, 8 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/582,471, dated Mar. 24, 2021, 11 pages.
Non-Final Office Action for U.S. Appl. No. 16/597,952, dated May 26, 2021, 7 pages.
Notice of Allowance for U.S. Appl. No. 16/582,471, dated Jun. 22, 2021, 9 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, mailed Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
International Search Report and Written Opinion for International Patent Application No. PCT/US2021/052151, dated Jan. 4, 2022, 16 pages.
Notice of Allowance for U.S. Appl. No. 15/964,762, dated Mar. 18, 2019, 7 pages.
Non-Final Office Action for U.S. Appl. No. 16/263,316, dated Dec. 23, 2019, 10 pages.
Final Office Action for U.S. Appl. No. 16/263,316, dated May 13, 2020, 10 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Final Office Action for U.S. Appl. No. 16/807,575, dated May 4, 2022, 12 pages.
Written Opinion for International Patent Application No. PCT/US2021/052830, dated Nov. 3, 2022, 7 pages.

(56) References Cited

OTHER PUBLICATIONS

International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Non-Final Office Action for U.S. Appl. No. 17/146,765, dated Sep. 7, 2022, 10 pages.
Final Office Action for U.S. Appl. No. 17/163,642, dated Nov. 25, 2022, 13 pages.
Notice of Allowance for U.S. Appl. No. 17/032,553, dated Oct. 11, 2022, 7 pages.
Advisory Action for U.S. Appl. No. 16/807,575, dated Jul. 28, 2022, 3 pages.
Notice of Allowance for U.S. Appl. No. 16/807,575, dated Aug. 19, 2022, 8 pages.
Notice of Allowance for U.S. Appl. No. 17/148,064, dated Aug. 18, 2022, 8 pages.
Non-Final Office Action for U.S. Appl. No. 17/163,642, dated Aug. 17, 2022, 9 pages.
Final Office Action for U.S. Appl. No. 17/032,553, dated Jul. 29, 2022, 6 pages.
Extended European Search Report for European Patent Application No. 22153526.3, dated Jul. 13, 2022, 9 pages.
Notice of Allowance for U.S. Appl. No. 17/163,642, dated Mar. 1, 2023, 10 pages.
Final Office Action for U.S. Appl. No. 17/073,764, dated Mar. 3, 2023, 14 pages.
International Preliminary Report on Patentability for International Patent Application No. PCT/US2021/052830, dated Feb. 20, 2023, 21 pages.
First Office Action for Chinese Patent Application No. 202010083654.0, dated May 12, 2023, 17 pages.
Notification to Grant for Chinese Patent Application No. 202010097807.7, dated Jul. 11, 2023, 14 pages.
International Preliminary Report on Patentability for International Patent Application No. PCT/US2021/050892, dated Oct. 24, 2022, 20 pages.
Non-Final Office Action for U.S. Appl. No. 17/363,568, dated Nov. 9, 2023, 8 pages.
Decision to Grant for Chinese Patent Application No. 202010083654.0, dated Sep. 11, 2023, 8 pages.

\* cited by examiner

FAST-SWITCHING POWER MANAGEMENT CIRCUIT AND RELATED APPARATUS

FIELD OF THE DISCLOSURE

The technology of the disclosure relates generally to power management in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Average power tracking (APT) is a well-known power management technology designed to improve efficiency levels of power amplifiers to help reduce power consumption and thermal dissipation in a mobile communication device. In an APT system, a power management circuit is configured to provide an output voltage(s) to a power amplifier(s) based on an average power envelope of an RF signal(s) being amplified by the power amplifier(s). Notably, the average power envelope of the RF signal can change (e.g., increase or decrease) between frames or even symbols. As such, the power management circuit must be able to adapt the output voltage(s) on a per-frame or per-symbol basis. In this regard, the power management circuit must be able to adapt the output voltage(s) within a short switching interval (e.g., one microsecond) such that the power amplifier(s) can operate with optimal efficiency and linearity.

SUMMARY

Aspects disclosed in the detailed description include a fast-switching power management circuit. The fast-switching power management circuit is configured to generate an output voltage(s) based on an output voltage target that may change on a per-frame or per-symbol basis. In embodiments disclosed herein, the fast-switching power management circuit can be configured to adapt (increase or decrease) the output voltage(s) within a very short switching interval (e.g., less than one microsecond). As a result, when the fast-switching power management circuit is employed in a wireless communication apparatus to supply the output voltage(s) to a power amplifier circuit(s), the fast-switching power management circuit can quickly adapt the output voltage(s) to help improve operating efficiency and linearity of the power amplifier circuit(s).

In one aspect, a fast-switching power management circuit is provided. The fast-switching power management circuit includes a multi-level voltage circuit configured to generate a plurality of output voltages based on a supply voltage. The fast-switching power management circuit also includes a switch circuit coupled to the multi-level voltage circuit to receive the plurality of output voltages. The fast-switching power management circuit also includes a control circuit. The control circuit is configured to determine an output voltage target. The control circuit is also configured to control the switch circuit to output a lowest one of the plurality of output voltages that is greater than or equal to the output voltage target.

In another aspect, a wireless communication apparatus is provided. The wireless communication apparatus includes a fast-switching power management circuit. The fast-switching power management circuit includes a multi-level voltage circuit configured to generate a plurality of output voltages based on a supply voltage. The fast-switching power management circuit also includes a switch circuit coupled to the multi-level voltage circuit to receive the plurality of output voltages. The fast-switching power management circuit also includes a control circuit. The control circuit is configured to determine an output voltage target. The control circuit is also configured to control the switch circuit to output a lowest one of the plurality of output voltages that is greater than or equal to the output voltage target.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
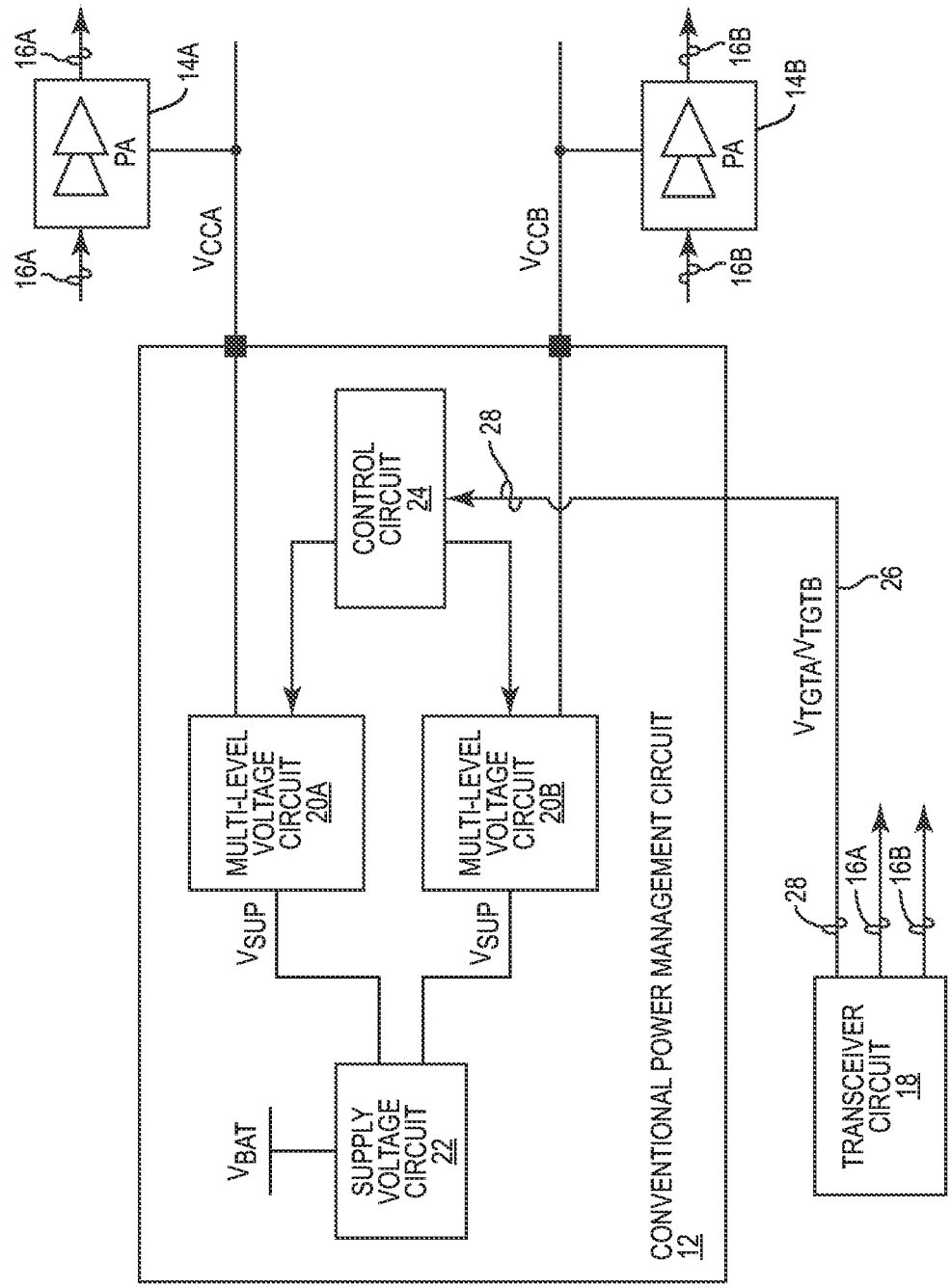
FIG. 1 is a schematic diagram of an exemplary wireless communication apparatus including a conventional power management circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a fast-switching power management circuit. The fast-switching power management circuit is configured to generate an output voltage(s) based on an output voltage target that may change on a per-frame or per-symbol basis. In embodiments disclosed herein, the fast-switching power management circuit can be configured to adapt (increase or decrease) the output voltage(s) within a very short switching interval (e.g., less than one microsecond). As a result, when the fast-switching power management circuit is employed in a wireless communication apparatus to supply the output voltage(s) to a power amplifier circuit(s), the fast-switching power management circuit can quickly adapt the output voltage(s) to help improve operating efficiency and linearity of the power amplifier circuit(s).

Figure 2:
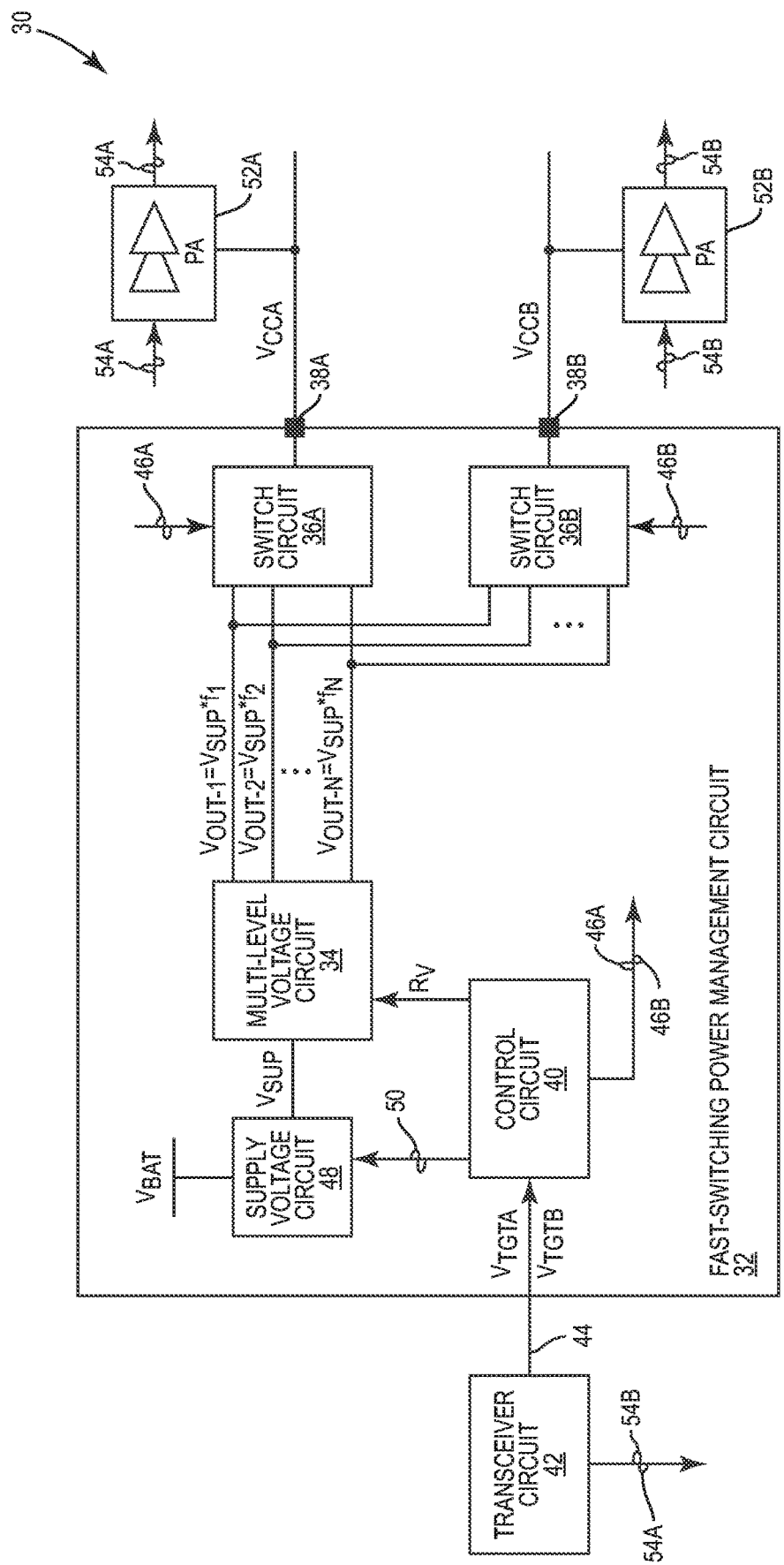
FIG. 2 is a schematic diagram of an exemplary wireless communication apparatus including a fast-switching power management circuit configured according to embodiments of the present disclosure to adapt an output voltage(s) under a very short switching interval.

Before discussing the fast-switching power management circuit according to the present disclosure, starting at FIG. 2, an overview of a conventional power management circuit is first provided with reference to FIG. 1.

FIG. 1 is a schematic diagram of an exemplary wireless communication apparatus 10 including a conventional power management circuit 12. The conventional power management circuit 12 is configured to provide a first output voltage $V_{CCA}$ to a first power amplifier circuit 14A (denoted as "PA") and a second output voltage $V_{CCB}$ to a second power amplifier circuit 14B (also denoted as "PA"). The first power amplifier circuit 14A is configured to amplify a first radio frequency (RF) signal 16A based on the first output voltage $V_{CCA}$ and the second power amplifier circuit 14B is configured to amplify a second RF signal 16B based on the second output voltage $V_{CCB}$. The wireless communication apparatus 10 includes a transceiver circuit 18 that provides the first RF signal 16A and the second RF signal 16B to the first power amplifier circuit 14A and the second power amplifier circuit 14B, respectively.

The conventional power management circuit 12 includes a first multi-level voltage circuit 20A and a second multi-level voltage circuit 20B. The first multi-level voltage circuit 20A is configured to generate the first output voltage $V_{CCA}$ at multiple voltage levels based on a supply voltage $V_{SUP}$. The second multi-level voltage circuit 20B is configured to generate the second output voltage $V_{CCB}$ at multiple voltage levels based on the supply voltage $V_{SUP}$. The conventional power management circuit 12 also includes a supply voltage circuit 22 configured to generate the supply voltage $V_{SUP}$ based on a battery voltage $V_{BAT}$.

The conventional power management circuit 12 can include a control circuit 24, which may be communicatively coupled to the transceiver circuit 18 via an RF front-end (RFFE) bus 26. The control circuit 24 may receive a target voltage signal 28 that indicates a first target voltage $V_{TGTA}$ for the first power amplifier circuit 14A and a second target voltage $V_{TGTB}$ for the second power amplifier circuit 14B. Accordingly, the control circuit 24 controls the first multi-level voltage circuit 20A to generate the first output voltage $V_{CCA}$ that is higher than or equal to the first target voltage $V_{TGTA}$. Likewise, the control circuit 24 controls the second multi-level voltage circuit 20B to generate the second output voltage $V_{CCB}$ that is higher than or equal to the second target voltage $V_{TGTB}$.

Notably, the first target voltage $V_{TGTA}$ and/or the second target voltage $V_{TGTB}$ may change on a per-frame or even per-symbol basis. In this regard, the conventional power management circuit 12 needs to adapt the first output voltage $V_{CCA}$ and/or the second output voltage $V_{CCB}$ within a tight switching interval. For example, the first RF signal 16A and/or the second RF signal 16B can be a Wi-Fi signal. In this regard, the switching interval for the conventional power management circuit 12 to adapt the first output voltage $V_{CCA}$ and/or the second output voltage $V_{CCB}$ may be as short as sixteen microseconds (16 μs).

The 16 μs switching interval can be seen as an overall delay budget for a variety of delays associated with adapting the first output voltage $V_{CCA}$ and/or the second output voltage $V_{CCB}$. For example, the 16 μs switching interval should include a time taken by the transceiver circuit 18 to generate the target voltage signal 28 and transmit the target voltage signal 28 to the control circuit 24 over the RFFE bus 26. In addition, the 16 μs switching interval should also include a processing delay at the control circuit 24. Furthermore, the 16 μs switching interval should further include a voltage change delay (ramp-up/ramp-down) at the first multi-level voltage circuit 20A and/or the second multi-level voltage circuit 20B. As a result, the conventional power management circuit 12 may not be able to adapt the first output voltage $V_{CCA}$ and/or the second output voltage $V_{CCB}$ fast enough to keep pace with changes in the first target voltage $V_{TGTA}$ and/or the second target voltage $V_{TGTB}$, and thus can potentially compromise operating efficiency and linearity of the first power amplifier circuit 14A and/or the second power amplifier circuit 14B. Thus, it may be desirable to optimize the conventional power management circuit 12 to enable fast voltage switching within a voltage switching interval that can be as short as one (1) μs.

In this regard, FIG. 2 is a schematic diagram of an exemplary wireless communication apparatus 30 including a fast-switching power management circuit 32 configured according to embodiments of the present disclosure to adapt an output voltage $V_{CCA}$ and/or a second output voltage $V_{CCB}$ under a very short switching interval. In a non-limiting example, the fast-switching power management circuit 32 is capable of changing the output voltage $V_{CCA}$ and/or the second output voltage $V_{CCB}$ well under the desired 1 μs voltage switching interval (e.g., 0.5 μs). As such, the fast-switching power management circuit 32 can adapt the output voltage $V_{CCA}$ and/or the second output voltage $V_{CCB}$ on a per-frame or even per-symbol basis, thus making it possible for the wireless communication apparatus 30 to transmit RF signals at higher modulation bandwidth (e.g., >100 MHz) with improved Error Vector Magnitude (EVM), Voltage Standing Wave Ratio (VSWR), and battery life.

The fast-switching power management circuit 32 includes a multi-level voltage circuit 34 configured to simultaneously generate a number of output voltages $V_{out-1}$-$V_{out-N}$ based on a supply voltage $V_{SUP}$. In a non-limiting example, the output voltages $V_{out-1}$-$V_{out-N}$ are different from one another. By simultaneously generating the output voltages $V_{out-1}$-$V_{out-N}$, the fast-switching power management circuit 32 can significantly reduce ongoing voltage change delay at the multi-level voltage circuit 34 compared to the conventional power management circuit 12 in FIG. 1.

The fast-switching power management circuit 32 includes a switch circuit 36A coupled to the multi-level voltage circuit 34 to receive the output voltages $V_{out-1}$-$V_{out-N}$. The switch circuit 36A, which can include any number and type of switches configured according to any suitable topology, can be controlled to selectively output any one of the output voltages $V_{out-1}$-$V_{out-N}$ at a voltage output 38A as the output voltage $V_{CCA}$. Given that the output voltages $V_{out-1}$-$V_{out-N}$ are concurrently available, the switch circuit 36A can flexibly couple any of the output voltages $V_{out-1}$-$V_{out-N}$ to the voltage output 38A with negligible switching delay, thus making it possible for the fast-switching power management circuit 32 to adapt the output voltage $V_{CCA}$ under the desired 1 μs voltage switching interval. Further, by employing only one multi-level voltage circuit 34, the fast-switching power management circuit 32 may be implemented with a smaller footprint compared to the conventional power management circuit 12 in FIG. 1.

The fast-switching power management circuit 32 also includes a second switch circuit 36B coupled to the multi-level voltage circuit 34 to receive the output voltages $V_{out-1}$-$V_{out-N}$. The second switch circuit 36B, which can include any number and type of switches configured according to any suitable topology, can be controlled to selectively output any one of the output voltages $V_{out-1}$-$V_{out-N}$ at a second voltage output 38B as the second output voltage $V_{CCB}$. Given that the output voltages $V_{out-1}$-$V_{out-N}$ are concurrently available, the second switch circuit 36B can flexibly couple any of the output voltages $V_{out-1}$-$V_{out-N}$ to the second voltage output 38B with negligible switching delay, thus making it possible for the fast-switching power management circuit 32 to adapt the second output voltage $V_{CCB}$ under the desired 1 μs voltage switching interval.

The fast-switching power management circuit 32 can include a control circuit 40, which can be a field-programmable gate array (FPGA), as an example. The control circuit 40 is configured to determine an output voltage target $V_{TGTA}$ for the output voltage $V_{CCA}$ and control the switch circuit 36A to output a lowest one of the output voltages $V_{out-1}$-$V_{out-N}$ that is greater than or equal to the output voltage target $V_{TGTA}$ at the voltage output 38A as the output voltage $V_{CCA}$. In a non-limiting example, the control circuit 40 can receive the output voltage target $V_{TGTA}$ from a transceiver circuit 42 over an RFFE bus 44 and control the switch circuit 36A via a control signal 46A.

Similarly, the control circuit 40 is also configured to determine a second output voltage target $V_{TGTB}$ for the second output voltage $V_{CCB}$ and control the second switch circuit 36B to output a lowest one of the output voltages $V_{out-1}$-$V_{out-N}$ that is greater than or equal to the second output voltage target $V_{TGTB}$ at the second voltage output 38B as the second output voltage $V_{CCB}$. In a non-limiting example, the control circuit 40 can receive the second output voltage target $V_{TGTA}$ from the transceiver circuit 42 over the RFFE bus 44 and control the second switch circuit 36B via a second control signal 46B.

The fast-switching power management circuit 32 also includes a supply voltage circuit 48 configured to generate the supply voltage $V_{SUP}$ based on a battery voltage $V_{BAT}$. In a non-limiting example, the supply voltage circuit 48 can include a low-dropout (LDO) voltage regulator circuit or an inductor-based direct-current (DC) to DC (DC-DC) voltage converter.

The control circuit 40 may be configured to control the supply voltage circuit 48, for example via a voltage adjustment signal 50, to adjust the supply voltage $V_{SUP}$ to minimize a difference (a.k.a. headroom) between the supply voltage $V_{SUP}$ and the battery voltage $V_{BAT}$. For example, when a battery in the wireless communication apparatus 30 is fully charged, the battery voltage $V_{BAT}$ would be higher. As time goes by, the battery may be drained to cause the battery voltage $V_{BAT}$ to become lower. As such, if the supply voltage $V_{SUP}$ is maintained at a constant level, the difference between the supply voltage $V_{SUP}$ and the battery voltage $V_{BAT}$ will increase, which can result in potential power loss in the supply voltage circuit 48. In this regard, by minimizing the difference between the supply voltage $V_{SUP}$ and the battery voltage $V_{BAT}$, it is possible to reduce power loss at the supply voltage circuit 48.

In a non-limiting example, the multi-level voltage circuit is configured to generate each of the output voltages $V_{out-1}$-$V_{out-N}$ from the supply voltage $V_{SUP}$ based on a respective one of a number of scaling factors $f_1$-$f_N$. In this regard, each of the output voltages $V_{out-1}$-$V_{out-N}$ can be equal to the supply voltage $V_{SUP}$ multiplied by a respective one of the scaling factors $f_1$-$f_N$. For example, $V_{out-1}=V_{SUP}*f_1$, $V_{out-2}=V_{SUP}*f_2$, and $V_{out-N}=V_{SUP}*f_N$. Each of the scaling factors $f_1$-$f_N$ can be a function of a voltage ratio $R_V$. For example, $f_1=(1+R_V)$, $f2=(1-R_V)$, $f_N=(1+R_V-R_V)$. As such, the control circuit 40 can control the multi-level voltage circuit 34 to adjust the output voltages $V_{out-1}$-$V_{out-N}$ by simply changing the voltage ratio $R_V$.

Specifically, the control circuit 40 may dynamically determine the voltage ratio $R_V$ based on a higher one of the output voltage target $V_{TGTA}$ and the second output voltage target $V_{TGTB}$. For example, if the output voltage target $V_{TGTA}$ at one time is higher than the second output voltage target $V_{TGTB}$, the control circuit will determine the voltage ratio $R_V$ based on the output voltage target $V_{TGTA}$. However, if the second output voltage target $V_{TGTB}$ becomes higher than the output voltage target $V_{TGTA}$ at another time, the control circuit will then determine the voltage ratio $R_V$ based on the second output voltage target $V_{TGTB}$. By always determining the voltage ratio $R_V$ based on the higher one of the output voltage target $V_{TGTA}$ and the second output voltage target $V_{TGTB}$, it is possible to make sure that the fast-switching power management circuit 32 can always supply a sufficient level output voltage. Accordingly, the control circuit 40 can thus dynamically adjust the scaling factors $f_1$-$f_N$ based on the determined voltage ratio $R_V$.

In one non-limiting example, the output voltage target $V_{TGTA}$ is 5.0 V and the battery voltage $V_{BAT}$ is at 3.8 V. The control circuit 40 may set the voltage ratio $R_V$ to equal 0.5. As such, the scaling factors $f_1$, $f_2$, and $f_N$ will be 1.5 (1+0.5), 0.5 (1−0.5), and 1 (1+0.5−0.5), respectively. In this regard, for the multi-level voltage circuit 34 to generate the highest output voltage $V_{out-1}$ at 5.0 V, the supply voltage $V_{SUP}$ needs to be 3.33 V (5.0 V/(1+0.5)=3.33 V). The voltage headroom in this case will be 0.47 V (3.8 V−3.33 V=0.47 V). Accordingly, the output voltage $V_{out-2}$ will be 1.66 V (3.33 V*(1−0.5)=1.66 V) and the output voltage $V_{out-N}$ will be 3.33 V (3.33 V*(1+0.5−0.5)=3.33 V).

In another non-limiting example, the output voltage target $V_{TGTA}$ is 5.0 V and the battery voltage $V_{BAT}$ is at 2.8 V. The control circuit 40 may set the voltage ratio $R_V$ to equal 1. As such, the scaling factors $f_1$, $f_2$, and $f_N$ will be 2 (1+1), 0 (1−1), and 1 (1+1−1), respectively. In this regard, for the multi-level voltage circuit 34 to generate the highest output voltage $V_{out-1}$ at 5.0 V, the supply voltage $V_{SUP}$ needs to be 2.5 V (5.0 V/(1+1)=2.5 V). The voltage headroom in this case will be 0.3 V (2.8 V−2.5 V=0.3 V). Accordingly, the output voltage $V_{out-2}$ will be 0 V (2.5 V*(1−1)=0 V) and the output voltage $V_{out-N}$ will be 2.5 V (2.5 V*(1+1−1)=2.5 V).

The wireless communication apparatus 30 can include a first power amplifier circuit 52A (denoted as "PA") coupled to the switch circuit 36A. The first power amplifier circuit 52A is configured to amplify a first RF signal 54A based on the output voltage $V_{CCA}$ outputted by the switch circuit 36A. In a non-limiting example, the first RF signal 54A is a Wi-Fi signal transmitted in a 2.4 GHz Industrial, Scientific, and Medical (ISM) band. It should be appreciated that the first RF signal 54A can also be other type of signals, including but not limited to Long-Term Evolution (LTE) and Fifth-Generation New-Radio (5G-NR) signals to be transmitted in any licensed or unlicensed RF bands.

The wireless communication apparatus 30 can include a second power amplifier circuit 52B (denoted as "PA") coupled to the second switch circuit 36B. The second power amplifier circuit 52B is configured to amplify a second RF signal 54B based on the second output voltage $V_{CCB}$ outputted by the second switch circuit 36B. In a non-limiting example, the second RF signal 54B is a Wi-Fi signal transmitted in a 5 GHz ISM band. It should be appreciated that the second RF signal 54B can also be other type of signals, including but not limited to LTE and 5G-NR signals to be transmitted in any licensed or unlicensed RF bands.

Although the wireless communication apparatus 30 is shown to include only one of the fast-switching power management circuit 32 coupled to the first power amplifier circuit 52A and the second power amplifier circuit 54B, it should be appreciated that other configurations are also possible. In a non-limiting example, a second one of the fast-switching power management circuit 32 can be added to support additional power amplifier circuits. In an embodiment, one of the fast-switching power management circuit 32 can be collocated with an antenna(s) mounted on an upper edge of the wireless communication apparatus 30, while another one of the fast-switching power management circuit 32 can be collocated with another antenna(s) mounted on a lower edge of the wireless communication apparatus 30. Notably, such configuration can help mitigate interference caused by so-called "hand blocking effect" in the wireless communication apparatus 30.

Figure 3:
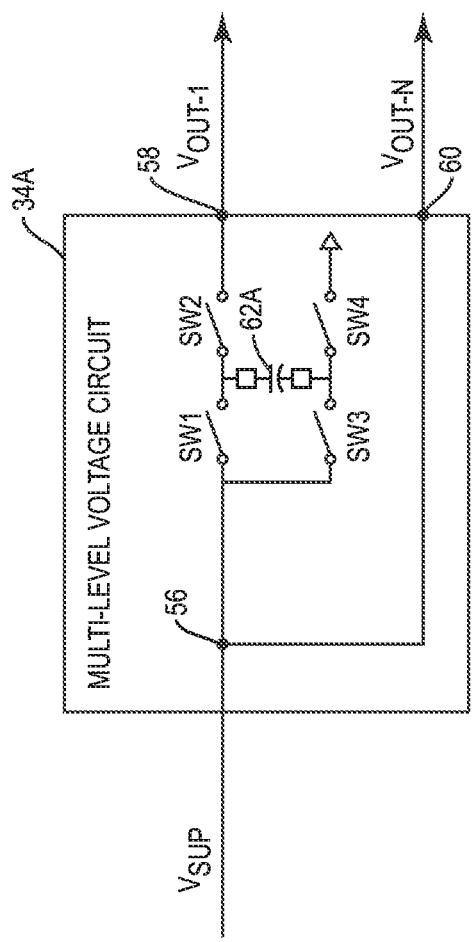
FIG. 3 is schematic diagram of an exemplary multi-level voltage circuit that can be provided in the fast-switching power management circuit in FIG. 2 to simultaneously generate multiple output voltages.

FIG. 3 is schematic diagram of an exemplary multi-level voltage circuit 34A that can be provided in the fast-switching power management circuit 32 in FIG. 2 as the multi-level voltage circuit 34. Common elements between FIGS. 2 and 3 are shown therein with common element numbers and will not be re-described herein.

For the convenience of illustration, the multi-level voltage circuit 34A is shown to generate only the output voltages $V_{out-1}$ and $V_{out-N}$. It should be appreciated that the multi-level voltage circuit 34A can be configured to generate any number of the output voltages $V_{out-1}$-$V_{out-N}$.

The multi-level voltage circuit 34A includes an input node 56 configured to receive the supply voltage $V_{SUP}$. The multi-level voltage circuit 34A includes a first output node 58 and a second output node 60 configured to output the output voltage $V_{out-1}$ and $V_{out-N}$, respectively. The multi-level voltage circuit 18A includes a first switch SW1, a second switch SW2, a third switch SW3, and a fourth switch SW4. The first switch SW1 and the second switch SW2 are coupled in series between the input node 56 and the first output node 58. The third switch SW3 and the fourth switch SW4 are coupled in series between the input node 56 and the second output node 60. The multi-level voltage circuit 34A includes a fly capacitor 62A having one end coupled in between the first switch SW1 and the second switch SW2, and another end coupled in between the third switch SW3 and the fourth switch SW4.

In a non-limiting example, the multi-level voltage circuit 34A can be controlled to generate the output voltage $V_{out-N}$ at the supply voltage $V_{SUP}$ ($V_{out-N}=V_{sup}$) and the output voltage $V_{out-1}$ at two times the supply voltage $V_{SUP}$ ($V_{out-1}=2*V_{SUP}$). As discussed earlier in FIG. 2, this is equivalent to setting the voltage ratio $R_V$ to 1.

To generate the output voltage $V_{out-1}$ at $2*V_{SUP}$, the first switch SW2 and the fourth switch SW4 are controlled to be closed, while the second switch SW2 and the third switch SW3 are controlled to be opened. As such, the fly capacitor 62A can be charged up to the supply voltage $V_{SUP}$. Subsequently, the first switch SW2 and the fourth switch SW4 are controlled to be opened, while the second switch SW2 and the third switch SW3 are controlled to be closed. Accordingly, the output voltage $V_{out-1}$ can be outputted at $2*V_{SUP}$.

Those skilled in the art will recognize improvements and modifications to the embodiments of the present disclosure. All such improvements and modifications are considered within the scope of the concepts disclosed herein and the claims that follow.

What is claimed is:
1. A fast-switching power management circuit comprising:
a multi-level voltage circuit configured to simultaneously generate a plurality of output voltages at different voltage levels based on a supply voltage;

a supply voltage circuit configured to generate the supply voltage based on a battery voltage, wherein the supply voltage differs from the battery voltage by a non-zero headroom;
a switch circuit and a second switch circuit each coupled to the multi-level voltage circuit to receive the plurality of output voltages, wherein:
the switch circuit is further coupled to a first power amplifier circuit configured to amplify a Wi-Fi signal transmitted in a 2.4 GHz Industrial, Scientific, and Medical (ISM) band based on one of the plurality of output voltages outputted by the switch circuit; and
the second switch circuit is further coupled to a second power amplifier circuit configured to amplify a Wi-Fi signal transmitted in a 5 GHz ISM band based on one of the plurality of output voltages outputted by the second switch circuit; and
a control circuit configured to:
determine an output voltage target and a second output voltage target;
control the switch circuit to output a lowest one of the plurality of output voltages that is greater than or equal to the output voltage target;
control the second switch circuit to output a lowest one of the plurality of output voltages that is greater than or equal to the second output voltage target; and
control the supply voltage circuit to adjust the supply voltage to minimize the headroom in response to a change of the battery voltage.

2. The fast-switching power management circuit of claim 1 wherein the control circuit is further configured to receive the output voltage target and the second output voltage target from a transceiver circuit.

3. The fast-switching power management circuit of claim 1 wherein the supply voltage circuit comprises a low-dropout (LDO) voltage regulator circuit.

4. The fast-switching power management circuit of claim 1 wherein the supply voltage circuit comprises an inductor-based direct-current (DC) to DC (DC-DC) voltage converter.

5. The fast-switching power management circuit of claim 1 wherein: the multi-level voltage circuit is further configured to generate each of the plurality of output voltages from the supply voltage based on a respective one of a plurality of scaling factors; and each of the plurality of scaling factors is a function of a voltage ratio.

6. The fast-switching power management circuit of claim 5 wherein the control circuit is further configured to:
dynamically determine the voltage ratio based on a higher one of the output voltage target and the second output voltage target; and
dynamically adjust the plurality of scaling factors based on the determined voltage ratio.

7. A wireless communication apparatus comprising:
a fast-switching power management circuit comprising:
a multi-level voltage circuit configured to simultaneously generate a plurality of output voltages at different voltage levels based on a supply voltage;
a supply voltage circuit configured to generate the supply voltage based on a battery voltage, wherein the supply voltage differs from the battery voltage by a non-zero headroom;
a switch circuit and a second switch circuit each coupled to the multi-level voltage circuit to receive the plurality of output voltages; and
a control circuit configured to:
determine an output voltage target and a second output voltage target;
control the switch circuit to output a lowest one of the plurality of output voltages that is greater than or equal to the output voltage target;
control the second switch circuit to output a lowest one of the plurality of output voltages that is greater than or equal to the second output voltage target; and
control the supply voltage circuit to adjust the supply voltage to minimize the headroom in response to a change of the battery voltage;
a first power amplifier circuit coupled to the switch circuit and configured to amplify a first radio frequency (RF) signal based on the one of the plurality of output voltages outputted by the switch circuit, wherein the first RF signal is a Wi-Fi signal transmitted in a 2.4 GHz Industrial, Scientific, and Medical (ISM) band; and
a second power amplifier circuit coupled to the second switch circuit and configured to amplify a second RF signal based on the one of the plurality of output voltages outputted by the second switch circuit, wherein the second RF signal is a Wi-Fi signal transmitted in a 5 GHz ISM band.

8. The wireless communication apparatus of claim 7 wherein the control circuit is further configured to determine the output voltage target and the second output voltage target based on a target voltage signal received from a transceiver circuit.

9. The wireless communication apparatus of claim 7 wherein the supply voltage circuit comprises a low-dropout (LDO) voltage regulator circuit.

10. The wireless communication apparatus of claim 7 wherein the supply voltage circuit comprises an inductor-based direct-current (DC) to DC (DC-DC) voltage converter.

11. The wireless communication apparatus of claim 7 wherein:
the multi-level voltage circuit is further configured to generate each of the plurality of output voltages from the supply voltage based on a respective one of a plurality of scaling factors; and
each of the plurality of scaling factors is a function of a voltage ratio.

12. The wireless communication apparatus of claim 11 wherein the control circuit is further configured to:
dynamically determine the voltage ratio based on a higher one of the output voltage target and the second output voltage target; and
dynamically adjust the plurality of scaling factors based on the determined voltage ratio.

13. The wireless communication apparatus of claim 8, further comprising the transceiver circuit.

14. The wireless communication apparatus of claim 8, wherein the transceiver circuit is further configured to generate the first RF signal and the second RF signal.

15. The wireless communication apparatus of claim 8, wherein the control circuit is further configured to receive the target voltage signal from the transceiver circuit via an RF frontend (RFFE) bus.

16. The wireless communication apparatus of claim 7, further comprising a second fast-switching power management circuit.

17. The wireless communication apparatus of claim 16, wherein the fast-switching power management circuit is collocated with an antenna mounted on an upper edge of the wireless communication apparatus and the second fast-switching power management circuit is collocated with a second antenna mounted on a lower edge of the wireless communication apparatus.

\* \* \* \* \*